(12) United States Patent
Xin et al.

(10) Patent No.: US 10,516,015 B2
(45) Date of Patent: Dec. 24, 2019

(54) ORGANIC LIGHT-EMITTING DISPLAY PANEL AND ORGANIC LIGHT-EMITTING DISPLAY DEVICE

(71) Applicant: SHANGHAI TIANMA AM-OLED CO., LTD., Shanghai (CN)

(72) Inventors: Yu Xin, Shanghai (CN); Yue Li, Shanghai (CN); Lijing Han, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 0 days.

(21) Appl. No.: 16/147,582

(22) Filed: Sep. 29, 2018

(65) Prior Publication Data

US 2019/0035875 A1 Jan. 31, 2019

(30) Foreign Application Priority Data

May 22, 2018 (CN) .......................... 2018 1 0494363

(51) Int. Cl.

| | |
|---|---|
| *G09G 1/00* | (2006.01) |
| *H01L 27/32* | (2006.01) |
| *H01L 27/12* | (2006.01) |
| *G09G 3/3266* | (2016.01) |
| *G09G 3/3291* | (2016.01) |

(52) U.S. Cl.
CPC ....... *H01L 27/3276* (2013.01); *G09G 3/3266* (2013.01); *G09G 3/3291* (2013.01); *H01L 27/124* (2013.01); *G09G 2300/0426* (2013.01)

(58) Field of Classification Search
CPC ......... H01L 27/32; H01L 27/12; H01L 21/00; H01L 27/3244; G09G 2330/0426; G09G 2330/043
See application file for complete search history.

(56) References Cited

U.S. PATENT DOCUMENTS

2017/0062545 A1* 3/2017 Oh ...................... H01L 27/3276

FOREIGN PATENT DOCUMENTS

CN 106298842 A 1/2017

\* cited by examiner

*Primary Examiner* — Michael A Faragalla
(74) *Attorney, Agent, or Firm* — Kilpatrick Townsend & Stockton, LLP (57) ABSTRACT

An organic light-emitting display panel is provided. The display panel includes a first driving voltage line arranged on an interlayer insulation layer and electrically connected with a source electrode or drain electrode of a driving transistor, a first reference voltage line arranged on a substrate and configured to extend in a first direction; a second reference voltage line arranged on the substrate and configured to extend in a second direction perpendicular to the first direction. A first electrode of the first switch transistor is electrically connected with the first reference voltage line, and a second electrode of the first switch transistor is electrically connected with a first electrode plate of a capacitor. A first electrode of the second switch transistor is electrically connected with the second reference voltage line, and a second electrode of the second switch transistor is electrically connected with a gate electrode of the driving transistor.

19 Claims, 10 Drawing Sheets

ORGANIC LIGHT-EMITTING DISPLAY PANEL AND ORGANIC LIGHT-EMITTING DISPLAY DEVICE

CROSS-REFERENCE TO RELATED APPLICATIONS

The present application claims priority to Chinese Patent Application No. 201810494363.3, filed on May 22, 2018, the content of which is incorporated herein by reference in its entirety.

TECHNICAL FIELD

The present disclosure relates to the field of display technologies and, particularly, relates to an organic light-emitting display panel and an organic light-emitting display device.

BACKGROUND

With the development of display technologies, an organic light-emitting display (OLED) panel has been applied more and more widely due to its excellent characteristics such as self-luminescence, high brightness, wide viewing angle, and rapid response.

Generally, the organic light-emitting display panel includes a display region and a frame region around the display region. The display region is used for displaying. The frame region is used for arranging a peripheral circuit. The arrangement of the current display panel and peripheral circuit are more and more complicated. Therefore, more space of the frame region is occupied, which is not beneficial to implementation of a narrow frame.

SUMMARY

The present disclosure provides an organic light-emitting display panel and an organic light-emitting display device, which can reduce space area of a frame region occupied by a peripheral circuit, thereby facilitating the implementation of a narrow frame.

One embodiment of the present disclosure, an organic light-emitting display panel is provided. The organic light-emitting display panel includes: a substrate; a semiconductor of a first switch transistor arranged on the substrate; a semiconductor of a second switch transistor arranged on the substrate; a semiconductor of a driving transistor arranged on the substrate and having one or more bending portions; a gate insulation layer covering the semiconductor of the first switch transistor, the semiconductor of the second switch transistor, and the semiconductor of the driving transistor; a gate electrode of the first switch transistor located on the gate insulation layer and overlapping the semiconductor of the first switch transistor; a gate electrode of the second switch transistor located on the gate insulation layer and overlapping the semiconductor of the second switch transistor; a gate electrode of the driving transistor located on the gate insulation layer and overlapping the semiconductor of the driving transistor; an interlayer insulation layer covering the gate electrode of the first switch transistor, the gate electrode of the second switch transistor, and the gate electrode of the driving transistor; a first driving voltage line arranged on the interlayer insulation layer and electrically connected to a source electrode or a drain electrode of the driving transistor; a first electrode plate of a capacitor arranged on the substrate and overlapping the gate electrode of the driving transistor; a first reference voltage line arranged on the substrate and extending in a first direction; a second reference voltage line arranged on the substrate and extending in a second direction perpendicular to the first direction; a first electrode of the first switch transistor electrically connected to the first reference voltage line, a second electrode of the first switch transistor electrically connected to the first electrode plate of the capacitor; a first electrode of the second switch transistor electrically connected to the second reference voltage line, and a first electrode of the second switch transistor electrically connected to the gate electrode of the driving transistor.

Another embodiment the present disclosure, an organic light-emitting display device is provided including the organic light-emitting display panel as described above.

In the organic light-emitting display panel provided in embodiments of the present disclosure, the first reference voltage line and the second reference voltage line respectively extend along the first direction and the second direction. The driving chip and the display region are arranged along the first direction or the second direction. That is, one reference voltage signal line can extend to the non-display region and then be directly connected with the driving chip, without an extra connecting line. Therefore, the arrangement manner of the first reference voltage line and the second reference voltage line occupies little space of the frame region, which is beneficial to the implementation of a narrow frame.

BRIEF DESCRIPTION OF DRAWINGS

In order to more clearly explain embodiments of the present disclosure or the technical solution in the related art, the drawings to be used in the description of the embodiments or the related art will be briefly described below. The drawings in the following description are merely some embodiments of the present disclosure.

DESCRIPTION OF EMBODIMENTS

The present disclosure will be further clearly described with reference to the accompanying drawings. The described embodiments are part of the embodiments of the present disclosure but not all of the embodiments.

The terms used in the embodiments of the present disclosure are merely for the purpose of describing particular embodiments but not intended to limit the present disclosure. Unless otherwise noted in the context, the singular form expressions "a", "an", "the" and "said" used in the embodiments and appended claims of the present disclosure are also intended to represent a plural form thereof.

Figure 1:
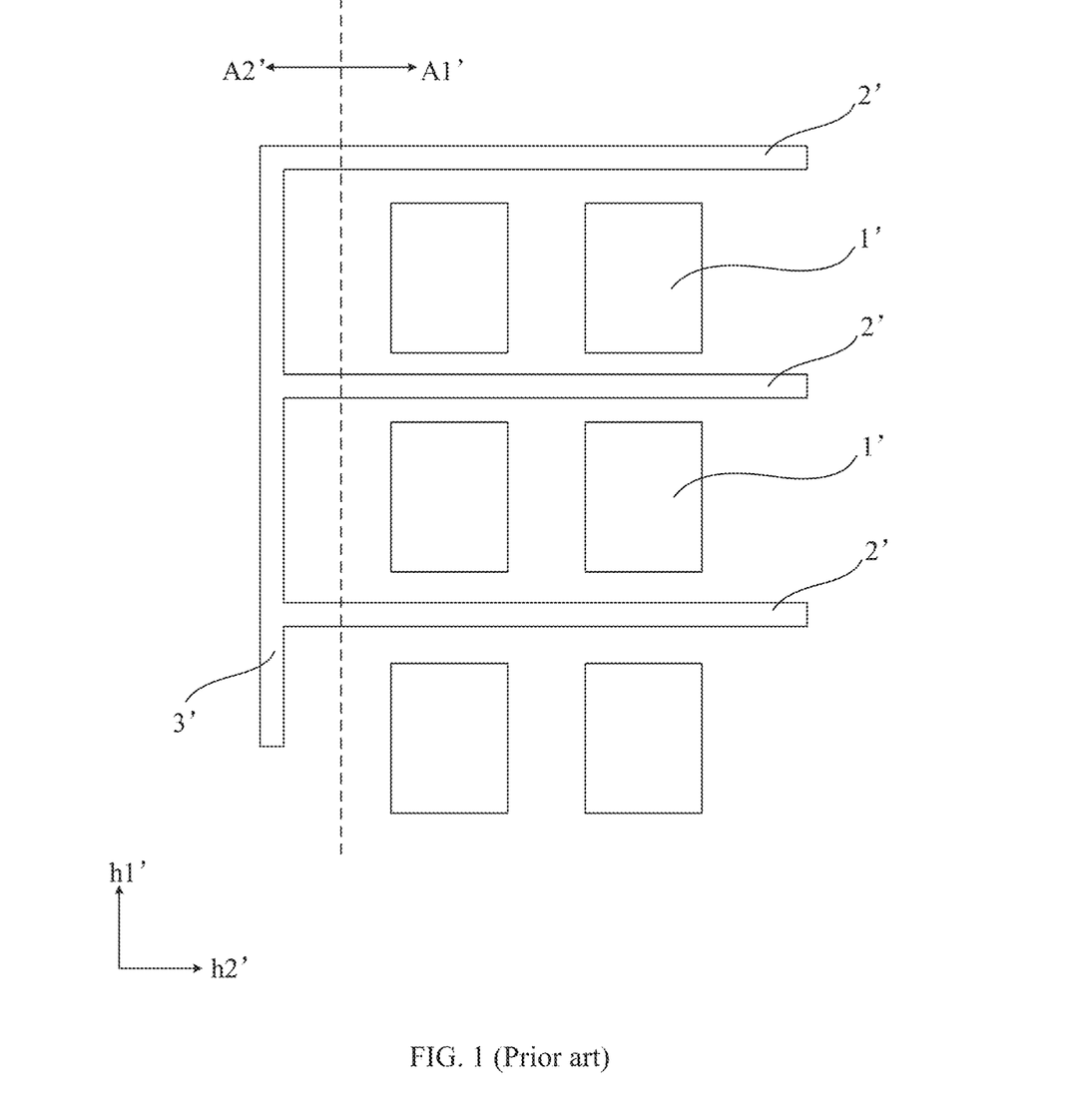
FIG. 1 is a partial structural schematic diagram of a display panel in the related art.

To further illustrate beneficial effects of the embodiments of the present disclosure, defects of the related art are illustrated before introducing the embodiments of the present disclosure. FIG. 1 is a partial structural schematic diagram of a display panel in the related art. As shown in FIG. 1, the display panel includes a display region A1' and a non-display region A2' (i.e., a frame region), and the display region A1' includes sub-pixels 1'. Each of the sub-pixels 1' is arranged with a corresponding pixel driving circuit (not shown in FIG. 1). In order to realize the normal operation of the pixel driving circuit, it is necessary to provide corresponding signals for the pixel driving circuit. For example, lines 2' arranging along a first direction h1' and extending along a second direction h2' are arranged in the display region A1'. Each of the signal lines 2' is connected with a corresponding pixel driving circuit configured to provide each pixel driving circuit with a required signal. In order to provide a same signal for all the signal lines 2', it is necessary for the signal lines 2' to be connected together in the non-display region A2', and then extend from the non-display region A2' to the driving chip (not shown in FIG. 1) to acquire corresponding signals. In general, the driving chip and the display region A1' are arranged along the first direction h1'. Therefore, it is necessary to provide in the non-display region A2' a connection line 3' extending in the first direction h1' to connect all the signal lines 2' together, and then connect to the driving chip. Therefore, the signal line 2' may occupy more frame region space, which is not conducive to implementation of a narrow frame.

Figure 2:
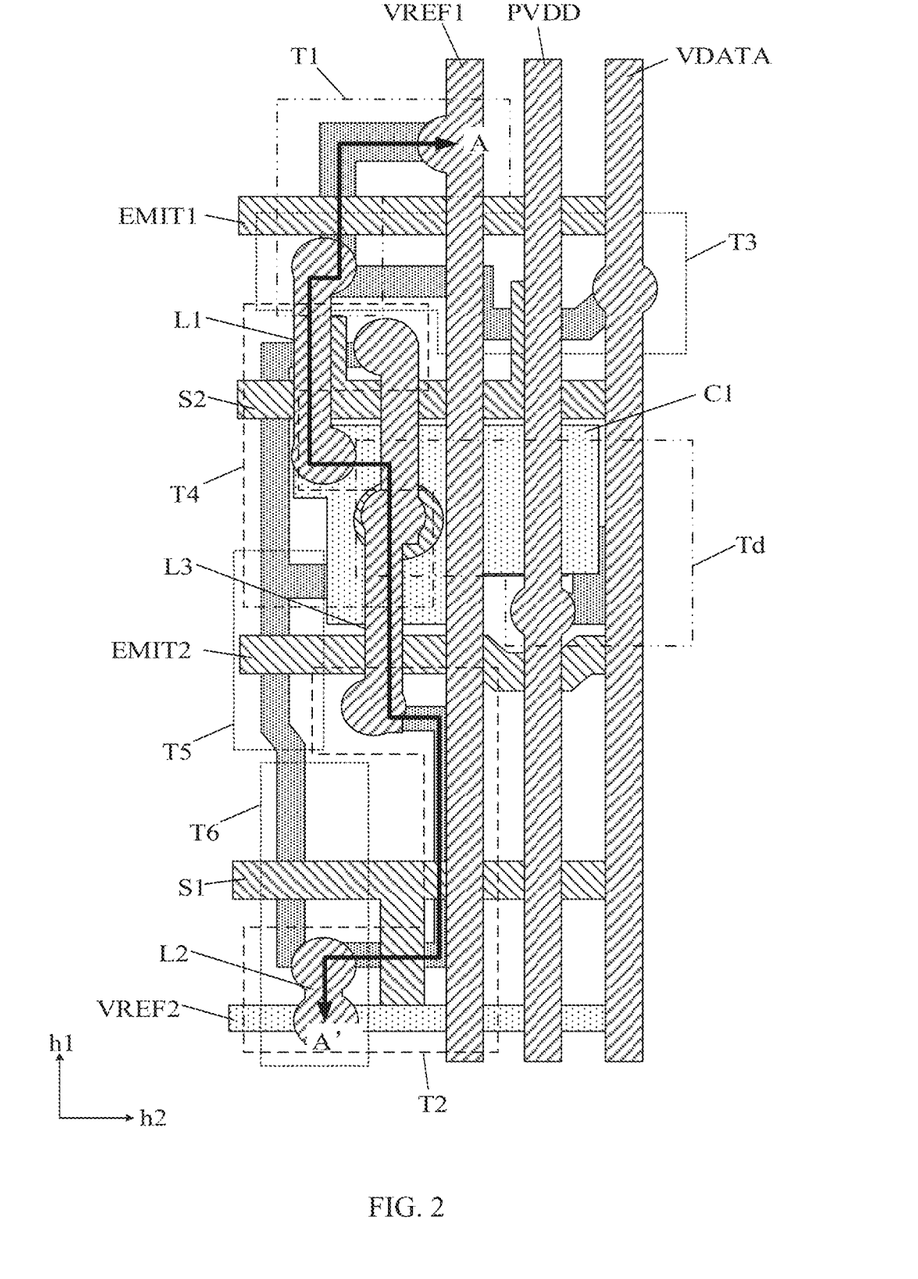
FIG. 2 is a partial structural schematic diagram of a display panel according to an embodiment of the present disclosure.
Figure 3:
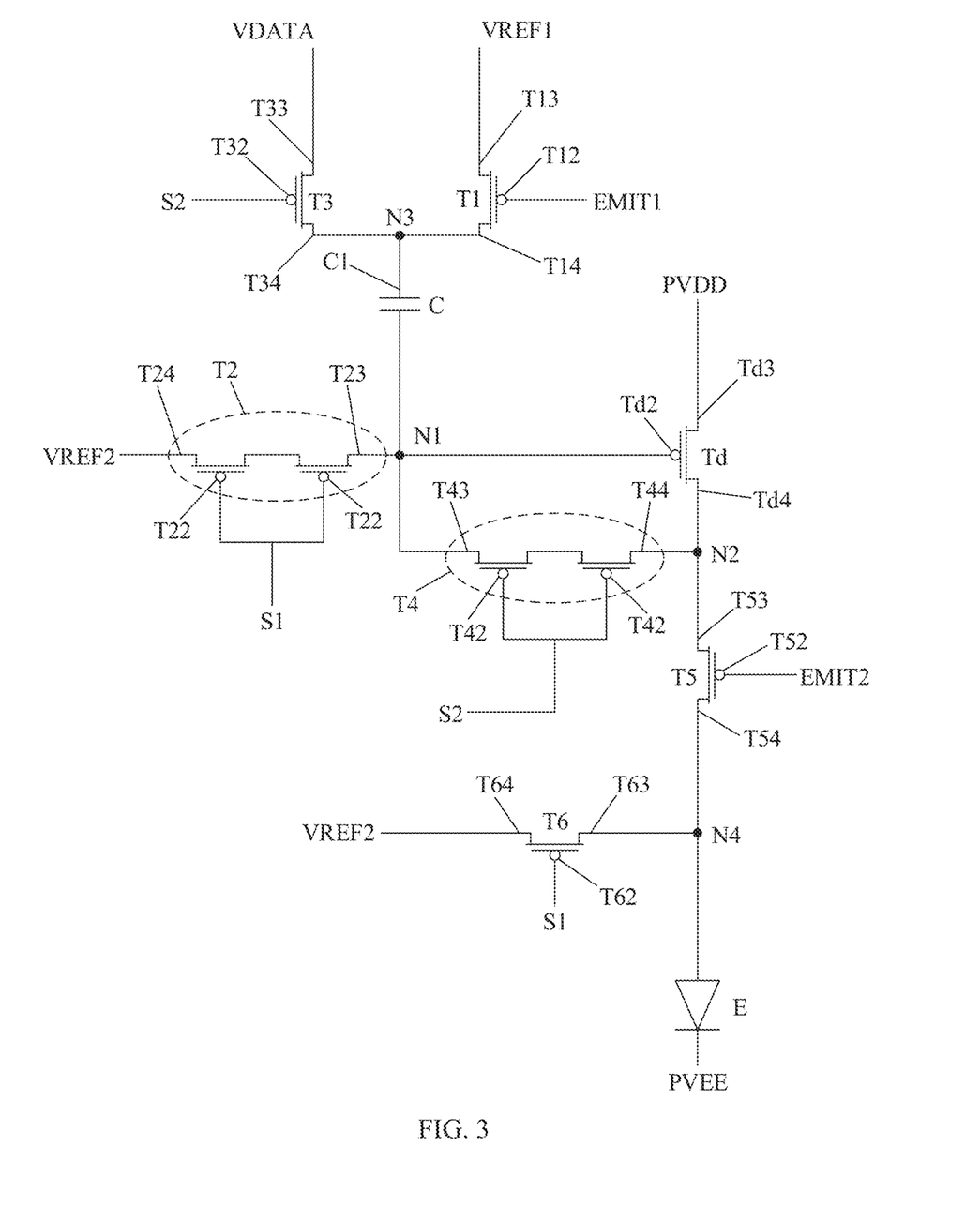
FIG. 3 is an equivalent circuit corresponding to FIG. 2.
Figure 4:
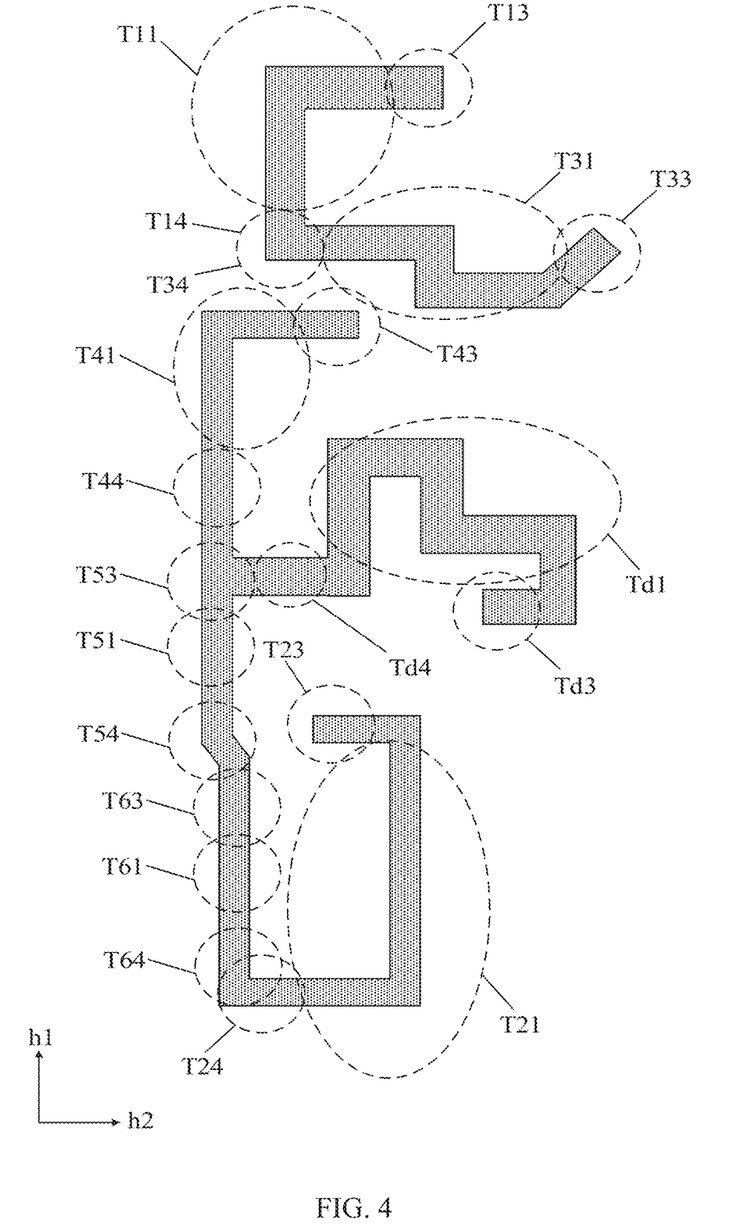
FIG. 4 is a structural schematic diagram of one layer of the display panel in FIG. 2.
Figure 5:
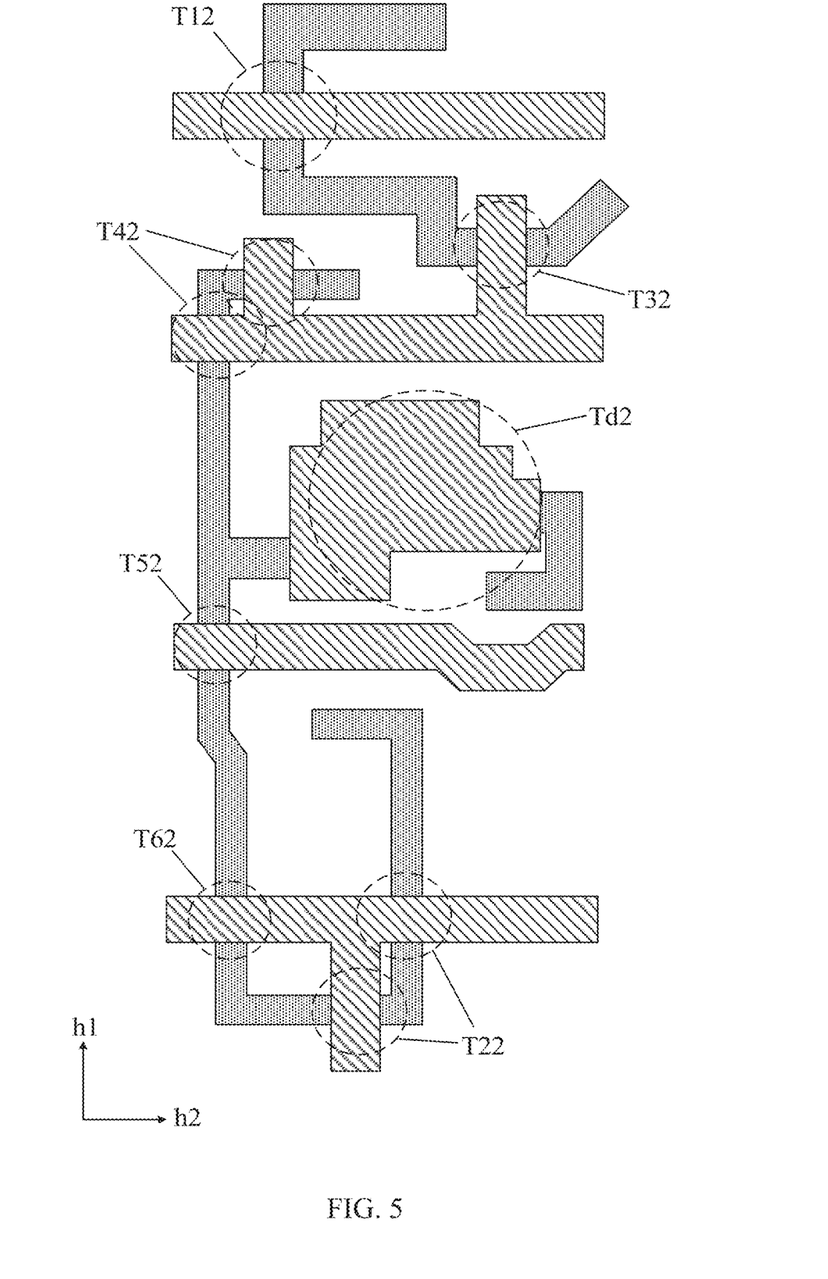
FIG. 5 is a structural schematic diagram of two layers of the display panel in FIG. 2.
Figure 6:
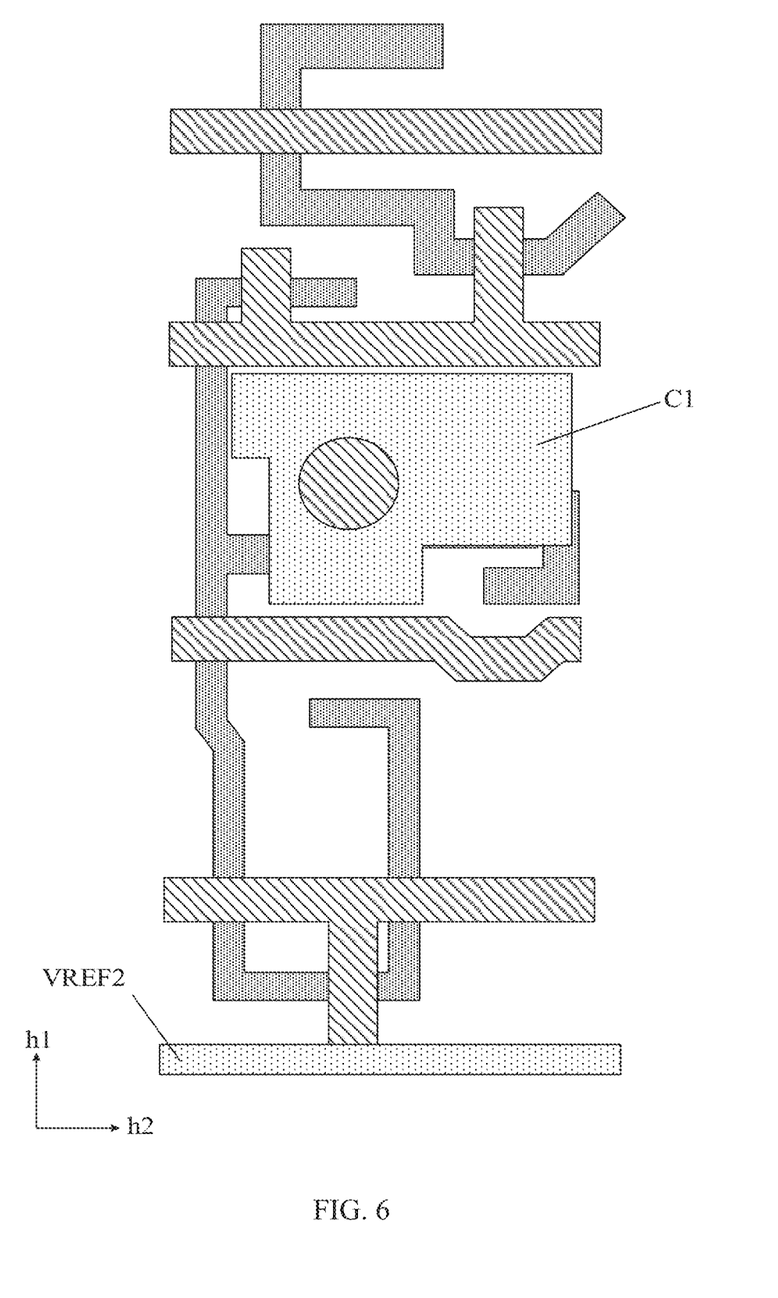
FIG. 6 is a structural schematic diagram of three layers of the display panel in FIG. 2.
Figure 7:
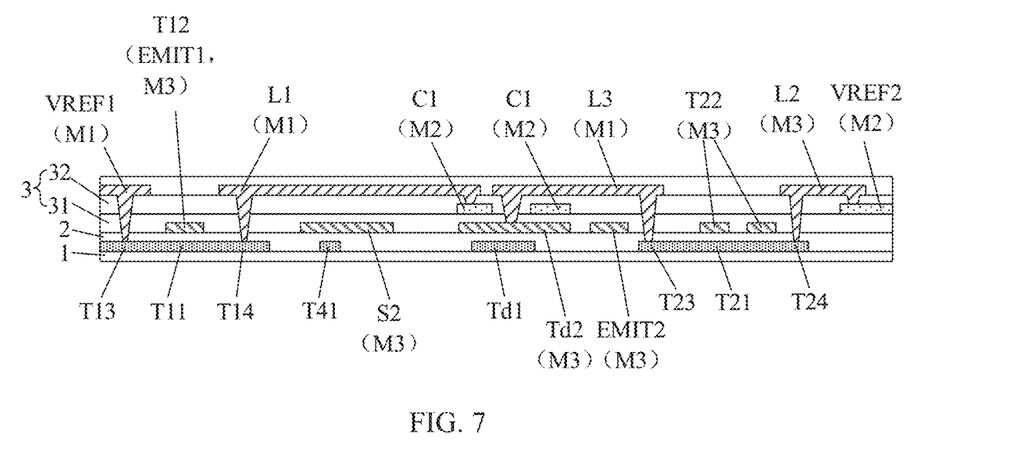
FIG. 7 is a structural schematic diagram showing a cross section along AA' direction in FIG. 2.

As shown in FIGS. 2-7, FIG. 2 is a partial structural schematic diagram of a display panel according to an embodiment of the present disclosure; FIG. 3 is an equivalent circuit corresponding to FIG. 2; FIG. 4 is a structural schematic diagram of one layer of the display panel in FIG. 2; FIG. 5 is a structural schematic diagram of two layers of the display panel in FIG. 2; FIG. 6 is a structural schematic diagram of three layers of the display panel in FIG. 2; and FIG. 7 is a structural schematic diagram showing a cross section along AA' direction in FIG. 2. The embodiments of the present disclosure provide an organic light-emitting display panel including a substrate 1, a semiconductor T11 of a first switch transistor T1, a semiconductor T21 of a second switch transistor T1, a semiconductor Td1 of a driving transistor Td, a gate insulation layer 2, a gate electrode T12 of the first switch transistor T1, a gate electrode T22 of the second switch transistor T2, a gate electrode Td2 of the driving transistor Td, an interlayer insulation layer 3, a first driving voltage line PVDD, a first electrode plate C1 of a capacitor C, a first reference voltage line VREF1, a second reference voltage line VREF2, a first and second electrode of the first switch transistor T1, a first and second electrode of the second switch transistor T2. The semiconductor T11 of the first switch transistor T1 is arranged on the substrate 1. The semiconductor T21 of the second switch transistor T2 is arranged on the substrate 1. The semiconductor Td1 of the driving transistor Td is arranged on the substrate 1 and configured to have one or more bending portions, in which the bending structure of the semiconductor Td1 of the driving transistor Td in the drawings is only an example, and the specific bending structure is not limited in the embodiments of the present disclosure. The gate insulation layer 2 is configured to cover the semiconductor T11 of the first switch transistor T1, the semiconductor T21 of the second switch transistor T2, and the semiconductor Td1 of the driving transistor Td. The gate electrode T12 of the first switch transistor T1 is located on the gate insulation layer 2 and overlapped with the semiconductor T11 of the first switch transistor T1. The gate electrode T22 of the second switch transistor T2 is located on the gate insulation layer 2 and overlapped with the semiconductor T21 of the second switch transistor T2, in which the second switch transistor T2 in the drawings is a double-gate structure including two gate electrodes T22, which is not limited in the embodiments of the present disclosure, for example, in other implementing manners, the second switch transistor T2 may be a single-gate structure only including one gate electrode T22. The gate electrode Td2 of the transistor Td is located on the gate insulation layer 2 and overlapped with the semiconductor Td1 of the driving transistor Td. The interlayer insulation layer 3 is configured to cover the gate electrode T12 of the first switch transistor T1, the gate electrode T22 of the second switch transistor T2, and the gate electrode Td2 of the driving transistor Td, for example, in the structure shown in FIG. 7, the interlayer insulation layer 3 includes a first interlayer insulation layer 31 and a second interlayer insulation layer 32. The first driving voltage line PVDD is arranged on the interlayer insulation layer 3 and electrically connected with a source electrode Td3 or a drain electrode Td4 of the driving transistor Td, in which, for example, the first driving voltage line PVDD is electrically connected with the source electrode Td3 of the driving transistor Td, for example, the first driving voltage line PVDD is directly connected with the source electrode Td3 of the driving transistor Td via the through holes in the interlayer insulation layer 3 and the gate insulation layer 2. It should be noted that in the embodiments of the present disclosure, the semiconductor of the transistor refers to a channel portion of the transistor in the semiconductor layer, two ends of the channel portion of the transistor in the semiconductor layer are respectively the source electrode and the drain electrode, and the source electrode and the drain electrode are the doped semiconductor portions which can transmit current, while the channel portion is the semiconductor portion overlapped with the gate electrode of the transistor, the voltage signal applied to the gate electrode can control turn-on or turn-off of the channel portion to realize functions of the switch transistor and the driving transistor. A first electrode plate C1 of the capacitor C arranged on the substrate 1 and overlapped with the gate electrode Td2 of the driving transistor Td, i.e., the gate electrode Td2 of the driving transistor Td serves as a second electrode plate of the capacitor C at the same time. The first reference voltage line VREF1 is arranged on the substrate 1 and configured to extend in a first direction h1. The second reference voltage line VREF2 is arranged on the substrate 1 and configured to extend in a second direction h2 perpendicular to the first direction h1. The first electrode of the first switch transistor T1 is electrically connected with the first reference voltage line VREF1, for example, the source electrode T13 of the first switch transistor T1 is electrically connected with the first reference voltage line VREF1, for example, the source electrode T13 of the first switch transistor T1 is directly connected with the first reference voltage line VREF1 via the through holes in the interlayer insulation layer 3 and the gate insulation layer 2.

For example, a second electrode of the first switch transistor T1 is electrically connected with the first electrode plate C1 of the capacitor C, for example, the drain electrode T14 of the first switch transistor T1 is electrically connected with the first electrode plate C1 of the capacitor C, for example, the drain electrode T14 of the first switch transistor T1 is connected with the first connection line L1 via the through holes in the interlayer insulation layer 3 and the gate insulation layer 2, and the first connection line L1 is configured to extend to the position at which the first electrode plate C1 of the capacitor C is located, and connect with the first electrode plate C1 via a through hole in the second interlayer insulation layer 32, so as to realize the electrical connection between the drain electrode T14 of the first switch transistor T1 and the first electrode plate C1 of the capacitor C. The first electrode of the second switch transistor T2 is electrically connected with the second reference voltage line VREF2, for example, the drain electrode T24 of the second switch transistor T2 is electrically connected with the second reference voltage line VREF2, for example, the drain electrode T24 of the second switch transistor T2 is connected with the second connection line L2 via the through holes in the interlayer insulation layer 3 and the gate insulation layer 2, and the second connection line L2 is configured to extend to the position at which the second reference voltage line VREF2 is located, and connect with the second reference voltage line VREF2 via a through hole in the second interlayer insulation layer 32 to realize the electrical connection between the drain electrode T24 of the second switch transistor T2 and the second reference voltage line VREF2. The electrical connection between the second electrode of the second switch transistor T2 and the gate electrode Td2 of the driving transistor Td, for example, the electrical connection between the source electrode T23 of the second switch transistor T2 and the gate electrode Td2 of the driving transistor Td, for example, the source electrode T23 of the second switch transistor T2 is connected with the third connection line L3 via the through holes in the interlayer insulation layer 3 and the gate insulation layer 2, and the third connection line L3 is configured to extend to the position at which the gate electrode Td2 of the driving transistor Td is located, and connect with the gate electrode Td2 of the driving transistor Td via a through hole in the interlayer insulation layer 3. At the junction between the third connection line L3 and the gate electrode Td2 of the driving transistor Td, a hollow structure is arranged on the first electrode plate C1 to prevent the first electrode plate C1 from short-circuiting with the gate electrode Td2 of the driving transistor Td. In this embodiment, the first and second electrodes of the transistor are a source electrode and a drain electrode, respectively. For example, if the first electrode is a source electrode, the second electrode is a drain electrode; and if the first electrode is a drain electrode, and the second electrode is a source electrode.

According to the organic light-emitting display panel in the embodiments of the present disclosure, the first reference voltage line VREF1 and the second reference voltage line VREF2 extend along the first direction h1 and the second direction h2, respectively. In the display panel, the driving chip and the display region are arranged along the first direction h1 or the second direction h2, i.e., one of the reference voltage signal lines can be directly connected with the driving chip after extending to the non-display region, without providing an extra connection line, therefore the space of the frame region is small due to the arrangement manner of the first reference voltage line VREF1 and the second reference voltage line VREF2, which is beneficial to implementation of a narrow frame.

In some embodiments, the first reference voltage line VREF1 is located in the first metal layer M1.

In some embodiments, the first metal layer M1 further includes a data line VDATA extending in the first direction h1.

The first reference voltage line VREF1 is configured to provide a first reference voltage for the first electrode plate C1 of the capacitor C. The second plate of the capacitor C is the gate electrode Td2 of the driving transistor Td. The potential at the gate electrode Td2 of the driving transistor Td is associated with a leakage current of the driving transistor Td, while the leakage current of the driving transistor Td is associated with brightness of the light-emitting device. The data line VDATA extends along a first direction h1. The first direction h1 is defined as a column direction and a second direction h2 is defined as a row direction. A driving process of the display panel is row by row; i.e., the pixel driving circuits in the same row are charged at the same time. After charging for the pixel driving circuits in the row is completed, charging for the pixel driving circuits of the next row is then performed. Assuming that the first reference voltage line VREF1 extends in the second direction h2, since the first reference voltage line VREF1 is connected with pixel driving circuits in the same row, if the first electrode plate C1 of a certain capacitor C in the pixel driving circuits in the same row is at an abnormal potential, the potential at the first electrode plate C1 of the capacitor C in the other pixel driving circuits in the same row may be affected by the first reference voltage line VREF1, thereby making the entire row of pixels display abnormally. In the embodiments of the present disclosure, the first reference voltage line VREF1 extends along the first direction h1, while pixel driving circuits in a same column are charged at different time periods, thus avoiding the problem that the abnormal potential of the first electrode plate C1 of the capacitor C in a certain pixel driving circuit may adversely affect other pixel driving circuits through the first reference voltage line VREF1. Both of the first reference voltage line VREF1 and the data line VDATA extend along the first direction h1 and may not affect each other, therefore, they can be arranged in a same layer and can be manufactured through a same patterning process, thereby saving processes.

In some embodiments, the organic light-emitting display panel further includes a third switch transistor T3. The semiconductor T31 of the third switch transistor T3 is located in the semiconductor layer. A first electrode of the third switch transistor T3 is electrically connected with the data line VDATA, for example, the source electrode T33 of the third switch transistor T3 is connected with the data line VDATA via the through holes in the interlayer insulation layer 3 and the gate insulation layer 2. The second electrode of the third switch transistor T3 is electrically connected with the first electrode plate C1 of the capacitor C, for example, the drain electrode T34 of the three-switch transistor T3 is electrically connected with the first electrode plate C1 of the capacitor C, i.e., the drain electrode T34 of the third switch transistor T3 is electrically connected with the drain electrode T14 of the first switch transistor T1.

In some embodiments, the first driving voltage line PVDD is located in the first metal layer M1 and extends in the first direction h1. Since the first driving voltage line PVDD, the first reference voltage line VREF1, and the data line VDATA all extend in the first direction h1 and do not affect each other, thus they can be arranged in a same layer and can be manufactured through a same patterning process, thereby saving processes.

In some embodiments, the second reference voltage line VREF2 is located in a second metal layer M2 different from the first metal layer M1.

Because the second reference voltage line VREF2 and the first reference voltage line VREF1 extend in two directions perpendicular to each other, the second reference voltage line VREF2 and the first reference voltage line VREF1 are respectively located in different metal layers so as to avoid mutual influence between them.

In some embodiments, the second reference voltage line VREF2 is electrically connected with the first electrode of the second switch transistor T2 via a through hole.

Since the second reference voltage line VREF2 is located at a different layer from the layer at which the source electrode T23 and the drain electrode T24 of the second switch transistor T2 are located, an electrical connection needs to be achieved via a through hole, for example, the drain electrode T24 of the second switch transistor T2, is electrically connected with the second reference voltage line VREF2, for example, the drain electrode T24 of the second switch transistor T2 is connected with the second connection line L2 via the through holes in the interlayer insulation layer 3 and the gate insulation layer 2. The second connection line L2 extends to the position at which the reference voltage line VREF2 is located, and is connected with the second reference voltage line VREF2 via the through hole in the interlayer insulation layer 3 so as to achieve the electrical connection between the drain electrode T24 of the second switch transistor T2 and the second reference voltage line VREF2. In another implementing manner, the drain electrode T24 of the second switch transistor T2 may extend to the position at which the second reference voltage line VREF2 is located. At this time, the drain electrode T24 of the second switch transistor T2 may electrically connect with the second reference voltage line VREF2 via the through holes in the interlayer insulation layer 3 and the gate insulation layer 2 directly. In this case, no additional second connection line L2 needs to be provided. No matter what structures of the drain electrodes T24 of the second switch transistor T2 are, the through hole is needed to realize the electrical connection between the drain electrode T24 of the second switch transistor T2 and the reference voltage line VREF2. It should be noted that the drawings only show the electrical connection structure between the drain electrode T24 of the second switch T2 and the second reference voltage VREF2 through the second connection line L2.

In some embodiments, the first electrode plate C1 of the capacitor C is located in the second metal layer M2.

The first electrode plate C1 and the second reference voltage line VREF2 are arranged in a same layer, and can be manufactured through a same patterning process, thereby saving processes.

In some embodiments, the organic light-emitting display panel further includes a second driving voltage line (not shown in the drawings), and the second driving voltage line is electrically connected with the first driving voltage line PVDD.

In some embodiments, the second driving voltage line is located in the second metal layer M2 and extends in the second direction h2.

The second driving voltage line is configured to connect a different first driving voltage line PVDD in order to make the potentials on the respective first driving voltage lines PVDD tend to be uniform.

In some embodiments, the organic light-emitting display panel further includes a scan line extending in the second direction h2, for example, a first scan line S1, which is electrically connected with the gate electrode T22 of the second switch transistor T2.

In some embodiments, the organic light-emitting display panel further includes a light-emitting control line extending in the second direction h2, for example, a first light-emitting control line EMIT1, which is electrically connected with the gate electrode T12 of the first switch transistor T1.

In some embodiments, the scan line (including the first scan line S1), the gate electrode T22 of the second switch transistor T2, the light-emitting control line (including the first light-emitting control line EMIT1), and the gate electrode T12 of the first switch transistor T1 are all located in a third metal layer M3.

In some embodiments, the third metal layer M3 and the second metal layer M2 are located in a same film layer (the structure in which the third metal layer M3 and the second metal layer M2 are located in the same film layer is not shown in the drawings).

In some embodiments, the second metal layer M2 is located between the third metal layer M3 and the first metal layer M1.

The interlayer insulation layer 3 includes a first interlayer insulation layer 31 and a second interlayer insulation layer 32. The first interlayer insulation layer 31 is located between the second metal layer M2 and the third metal layer M3. The inter-insulation layer 32 is located between the second metal layer M2 and the first metal layer M1.

Figure 8:
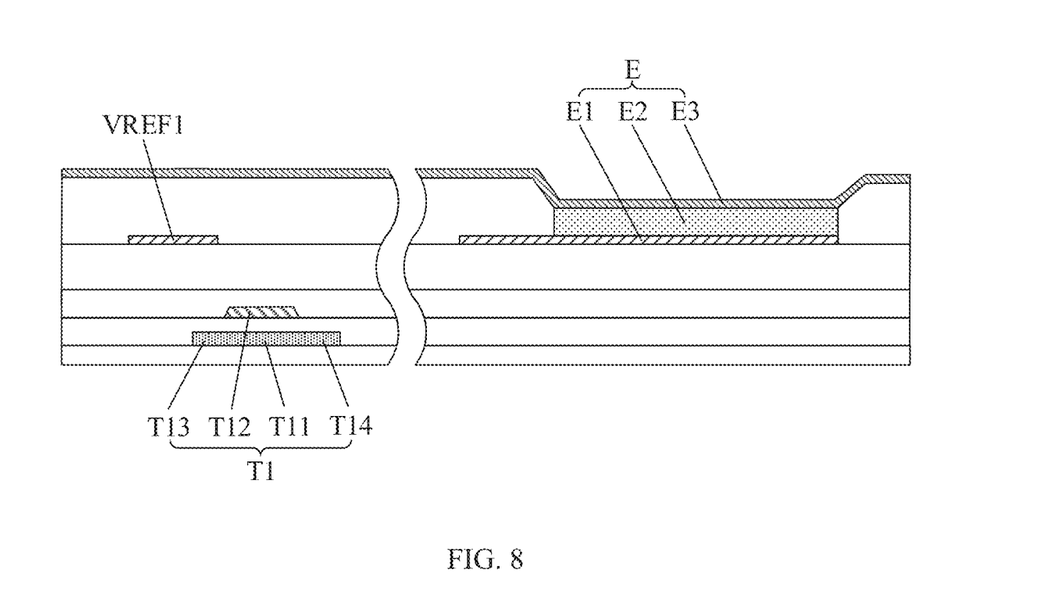
FIG. 8 is a structural schematic diagram showing a cross section of a first switch transistor and a light-emitting device in FIG. 3.

In some embodiments, as shown in FIG. 8, FIG. 8 is a structural schematic diagram showing a cross section of a first switch transistor and a light-emitting device in FIG. 3. The organic light-emitting display panel further includes: an anode E1; an organic light-emitting material layer E2 arranged on the anode E1; a cathode E3 arranged on the organic light-emitting material layer E2, and the first reference voltage line VREF1 or the second reference voltage line VREF2 and the anode E1 are arranged in a same film layer. FIG. 8 only shows the case that the first reference voltage line VREF1 and the anode E1 are arranged in a same film layer.

As shown in FIGS. 2 to 8. FIG. 3 shows a pixel driving circuit corresponding to one sub-pixel in an organic light-emitting display panel. The pixel driving circuit further includes a fourth switch transistor T4, a fifth switch transistor T5, a sixth switch transistor T6 and a light-emitting device E, and the light-emitting device E in FIG. 3 is omitted in FIG. 2. The scan line further includes a second scan line S2. The light-emitting control line further includes a second light-emitting control line EMIT2. The first electrode of the fourth switch transistor T4 is electrically connected with the gate electrode Td2 of the driving transistor Td. For example, the source electrode T43 of the fourth switch transistor T4 is electrically connected with the gate electrode Td2 of the driving transistor Td. The gate electrode Td2 of the driving transistor Td is defined as a first node N1, the second electrode of the driving transistor Td is defined as a second node N2, and the first electrode plate C1 of the capacitor C is defined as a third node N3. For example, the drain electrode Td4 of the driving transistor Td is the second node N2. The source electrode T43 of the fourth switch transistor T4 is electrically connected with the first node N1. The second electrode of the fourth switch transistor T4 is electrically connected with the second node N2. For example, the drain electrode T44 of the fourth switch transistor T4 is electrically connected with the second node N2. The gate electrode T42 of the fourth switch transistor T4 is electrically connected with the second scan line S2. The fourth switch transistor T4 may be a double gate structure, i.e., include two gate electrodes T42. The first electrode of the fifth switch transistor T5 is electrically connected with the second node N2. The second electrode of the fifth switch transistor T5 is electrically connected with a fourth node N4. For example, the source electrode T53 of the fifth switch transistor T5 is electrically connected with the second node N2, and the drain electrode T54 of the fifth switch transistor T5 is electrically connected with the fourth node N4. The first electrode of the sixth switch transistor T6 is electrically connected with the second reference voltage line VREF2, and the second electrode of the sixth switch transistor T6 is electrically connected with the fourth node N4. For example, the drain electrode T64 of the sixth switch transistor T6 is electrically connected with the second reference voltage line VREF2, and the source electrode T63 of the sixth switch transistor T6 is electrically connected with the fourth node N4. The fourth node N4 is electrically connected with the anode E1 of the light-emitting device E. The cathode E3 of the light-emitting device E is electrically connected with a third driving voltage line PVEE. The third driving voltage line PVEE is configured to supply the cathode E3 of the light-emitting device E with a required potential, and is not shown in FIG. 2. The anode E1 may be formed of various conductive materials. For example, the anode E1 can be made into a transparent electrode or a reflective electrode depending on the application. When the anode E1 is the transparent electrode, it may include the materials of indium tin oxide (ITO), indium zinc oxide (IZO), and zinc oxide (ZnO) or indium oxide ($In_2O_3$), etc. When the anode E1 is the reflective electrode, it may be formed of Ag, Mg, Al, Pt, Pd, Au, Ni, Nd, Ir, Cr or a mixture thereof, and ITO, IZO, ZnO, In2O3, or the like may be formed on the reflective layer. The organic light-emitting material layer E2 may be formed of a low molecular weight organic material or a high molecular weight organic material. The organic light-emitting material layer E2 may include an organic emission layer, and may further include at least one of a hole injection layer (HIL), a hole transport layer (HTL), an electron transport layer and an electron injection layer. In addition to the organic emission layer, the organic light-emitting material layer E2 may include other various functional layers. The cathode E3 is similar to the anode E1 and may be a transparent electrode or a reflective electrode. When the cathode E3 is a reflective electrode, the anode E1 is a transparent electrode, then the display panel is a top emission structure. When the cathode E3 is a transparent electrode, the anode E1 is a reflective electrode, then the display panel is a bottom emission structure. The anode E1 and the cathode E3 are insulated from each other by the organic light-emitting material layer E2. If a voltage is applied between the anode E1 and the cathode E3, the organic light-emitting material layer E2 emits visible light, thereby realizing luminous display of the sub-pixels.

Figure 9:
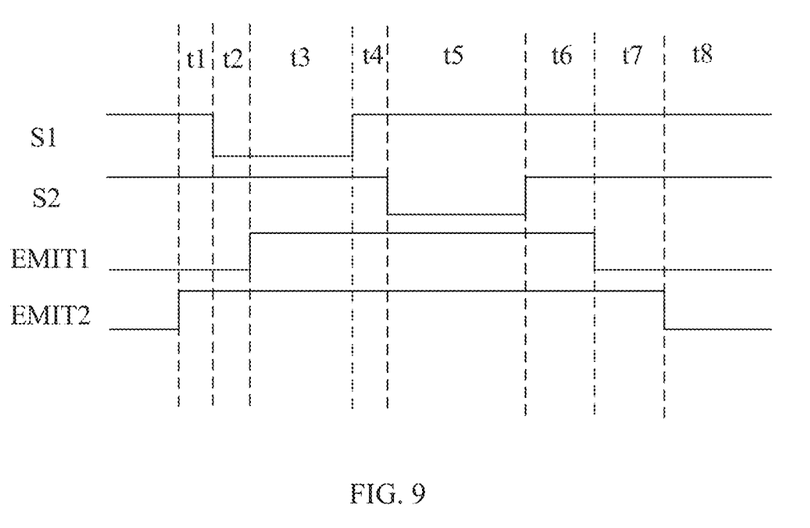
FIG. 9 is a sequence signal diagram of a pixel driving circuit in FIG. 3.

The organic light-emitting display panel according to the embodiments of the present disclosure is described hereafter by taking the pixel driving circuit shown in FIG. 3 as an example. As shown in FIGS. 3 and 9, FIG. 9 is a sequence signal diagram of the pixel driving circuit in FIG. 3.

In a first stage t1, each of the first scan line S1, the second scan line S2, and the second light-emitting control line EMIT2 provides a cut-off level (e.g., a high level) to control the second switch transistor T2, the third switch transistor T3, the fourth switch transistor T4, the fifth switch transistor T5 and the sixth switch transistor T6 to be cut off. The first light-emitting control line EMIT1 provides a turn-on level (e.g., a low level) to control turn-on of the first switch transistor T1. At this time, the voltage on the first reference voltage signal line VREF1 is transmitted to the third node N3 through the first switch transistor T1, so as to reset the third node N3. The potential of the third node N3 is Vref1.

In a second stage t2, each of the second scan line S2 and the second light-emitting control line EMIT2 provides a cut-off level to control the third switch transistor T3, the fourth switch transistor T4, and the fifth switch transistor T5 to be cut off. Each of the first scan line S1 and the first light-emitting control line EMIT1 provides a turn-on level to control the first switch transistor T1, the second switch transistor T2, and the sixth switch transistor T6 to be turned on. At this time, the voltage on the first reference voltage signal line VREF1 is transmitted to the third node N3 through the first switch transistor T1. The potential of the third node N3 is Vref1, so as to reset the third node N3. The voltage on the second reference voltage signal line VREF2 is transmitted to the first node N1 through the second switch transistor T2. The potential of the node N1 is Vref2, so as to reset the first node N1. The voltage on the second reference voltage signal line VREF2 is transmitted to the fourth node N4 through the sixth switch transistor T6, so as to reset the fourth node N4.

In a third stage t3, each of the second scan line S2, the first light-emitting control line EMIT1, and the second light-emitting control line EMIT2 provides a cut-off level to control the first switch transistor T1, the third switch transistor T3, the fourth switch transistor T4 and the fifth switch transistor T5 to be cut off. The first scan line S1 provides a turn-on level to control the second switch transistor T2 and the sixth switch transistor T6 to be turned on. The potential at the third node N3 is maintained as Vref1 by the effect of the capacitor C. The potential at node N1 is Vref2.

In a fourth stage t4, each of the first scan line S1, the second scan line S2, the first light-emitting control line EMIT1, and the second light-emitting control line EMIT2 provides a cut-off level to cut off all of the first switch transistor T1, the second switch transistor T2, the third switch transistor T3, the fourth switch transistor T4, the fifth switch transistor T5, and the sixth switch transistor T6. The first node N1 is maintained as Vref2 by the capacitor C, and the third node N3 is maintained as Vref1 by the capacitor C.

In a fifth stage t5, each of the first scan line S1, the first light-emitting control line EMIT1, and the second light-emitting control line EMIT2 provides a cut-off level to control the first switch transistor T1, the second switch transistor T2, the fifth switch transistor T5, and the sixth switch transistor T6 to be cut off. The second scan line S2 provides a turn-on level to control the third switch transistor T3 and the fourth switch transistor T4 to be turned on. At this time, the data voltage Vdata on the data line VDATA is transmitted to the third node N3 through the third switch transistor T3. The potential at the third node N3 is changed from Vref1 to Vdata. At this time, the driving transistor Td is turned on, and the current of the first driving voltage line PVDD is transmitted to the first node N1 through the driving transistor Td and the fourth switch transistor T4 until the driving transistor Td is cut off, so that the potential at the first node N1 becomes Vdd−|Vth|, Vdd is the potential of the first driving voltage line PVDD, and Vth is a threshold voltage of the driving transistor Td.

In a sixth stage t6, each the first scan line S1, the second scan line S2, the first light-emitting control line EMIT1, and the second light-emitting control line EMIT2 provides a cut-off level to cut off the first switch transistor T1, the second switch transistor T2, and the third switch transistor T3, the fourth switch transistor T4, the fifth switch transistor T5 and the sixth switch transistor T6. The third node N3 is maintained as Vdata by the capacitor C, and the first node N1 is maintained as Vdd−|Vth| by the capacitor C.

In a seventh stage t7, each of the first scan line S1, the second scan line S2, and the second light-emitting control line EMIT2 provides a cut-off level to control the second switch transistor T2, the third switch transistor T3, the fourth switch transistor T4, the fifth switch transistor T5 and the sixth switch transistor T6 to be cut off. The first light-emitting control line EMIT1 provides a turn-on level to control the first switch transistor T1 to be turned on. The voltage on the first reference voltage line VREF1 is transmitted to the third node N3 so as to change the potential at the third node N3 to Vref1, and change the potential at the first node N1 to Vref1−Vdata+(Vdd−|Vth|) by effect of the capacitor C.

In an eighth stage t8, each of the first scan line S1 and the second scan line S2 provides a cut-off level to control the second switch transistor T2, the third switch transistor T3, the fourth switch transistor T4, and the sixth switch transistor T6 to be cut off. The first light-emitting control line EMIT1 and the second light-emitting control line EMIT2 are turned on to control the first switch transistor T1 and the fifth switch transistor T5 to be turned on. The driving transistor Td is turned on by the effect of the potential of Vref1−Vdata+(Vdd−|Vth|) at the first node N1, and generates a driving current Id. The light-emitting device E emits light under the effect of the driving current Id according to a formula of the driving current, $$Id=K(Vdd-Vref1+Vdata-(Vdd-|Vth|)-|Vth|)^2,$$

i.e., $Id=K(Vdata-Vref1)^2$, where K is a constant. It can be seen that the driving current Id is independent of the threshold voltage of the driving transistor Td, and therefore, the threshold voltage drift is prevented from adversely affecting the brightness of the light-emitting device E.

It should be noted that the specific structure of the pixel driving circuit in FIG. 3 and the sequence signal in FIG. 9 are only examples, and the specific structure and sequence signal of the pixel driving circuit are not limited in the embodiments of the present disclosure.

Figure 10:
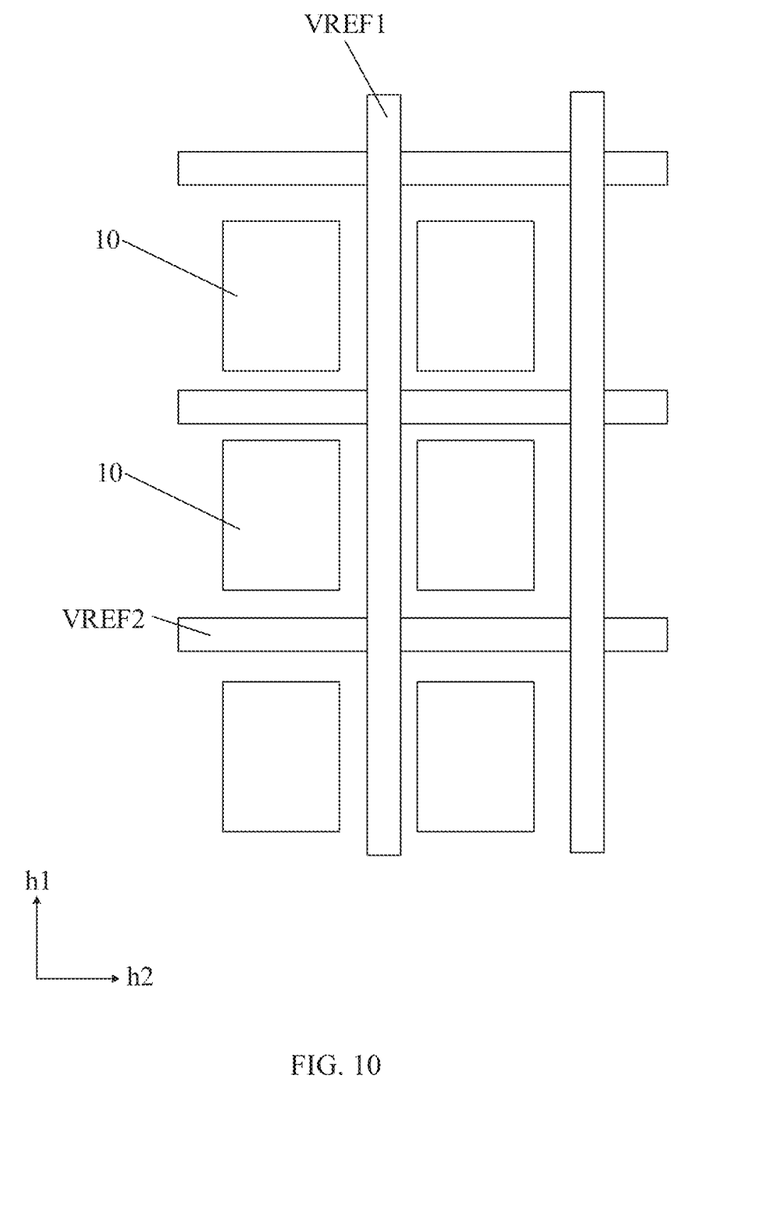
FIG. 10 is a partial schematic diagram of a display panel according to an embodiment of the present disclosure.

In some embodiments, as shown in FIGS. 2 and 10, FIG. 10 is a partial schematic diagram of a display panel according to an embodiment of the present disclosure. The organic light-emitting display panel includes sub-pixels 10 arranged in a matrix. Each of the sub-pixels 10 includes a first switch transistor T1, a second switch transistor T2 and a driving transistor Td. The first electrodes of the first switch transistors T1 of all sub-pixels 10 in a same column are electrically connected with a same first reference voltage line VREF1. For example, the source electrodes T13 of the first switch transistors T1 of all the sub-pixels 10 in a same column are electrically connected with a same first reference voltage line VREF1. The first electrodes of the second switch transistors T2 of all the sub-pixels 10 in a same row is electrically connected with a same second reference voltage line VREF2. For example, the drain electrodes T24 of the second switch transistors T2 of all the sub-pixels 10 in a same row are electrically connected with a same second reference voltage line VREF2.

In some embodiments, the reference voltage Vref1 transmitted by the first reference voltage line VREF1 is a positive potential, and the reference voltage Vref2 transmitted by the second reference voltage line VREF2 is a negative potential, so as to facilitate the reset of the first node N1.

Figure 11:
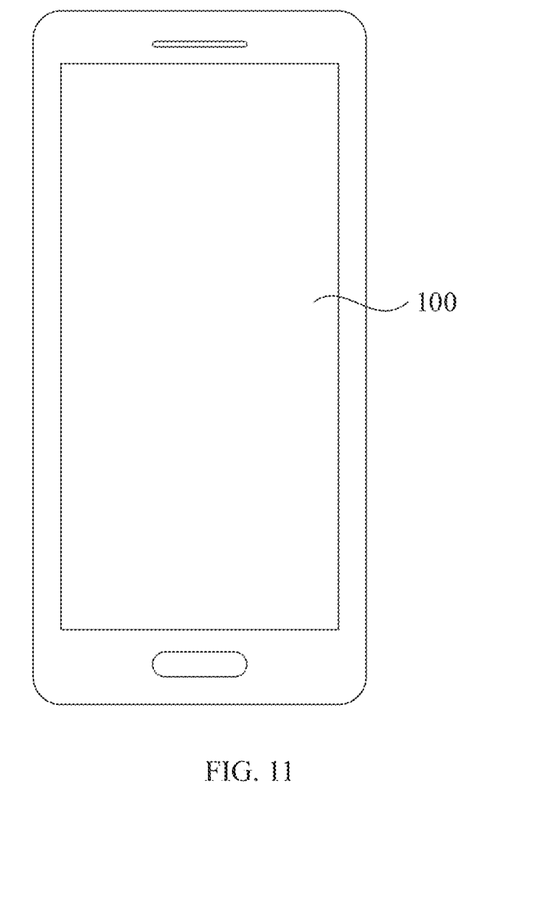
FIG. 11 is a structural schematic diagram of an organic light-emitting display device according to an embodiment of the present disclosure.

In some embodiments, as shown in FIG. 11, FIG. 11 is a structural schematic diagram of an organic light-emitting display device according to an embodiment of the present disclosure. An embodiment of the present disclosure provides an organic light-emitting display device including the above-mentioned organic light-emitting display panel 100.

The specific structure and principle of the organic light-emitting display panel 100 are the same as those of the above embodiments, and are not elaborated here. The display device may be any electronic device having a display function, such as a touch screen display, a mobile phone, a tablet computer, a notebook computer, an electronic paper book, or a television, and the like.

The foregoing embodiments are some of the embodiments of the present disclosure and are not intended to limit the present disclosure. Any modifications, equivalent substitutions and improvements made within the spirit and principle of the present disclosure shall be included the protection scope of the present disclosure.

What is claimed is:

1. An organic light-emitting display panel, comprising:
a substrate;
a semiconductor of a first switch transistor arranged on the substrate;
a semiconductor of a second switch transistor arranged on the substrate;
a semiconductor of a driving transistor arranged on the substrate and having one or more bending portions;
a gate insulation layer covering the semiconductor of the first switch transistor, the semiconductor of the second switch transistor, and the semiconductor of the driving transistor;
a gate electrode of the first switch transistor located on the gate insulation layer and overlapping the semiconductor of the first switch transistor;
a gate electrode of the second switch transistor located on the gate insulation layer and overlapping the semiconductor of the second switch transistor;
a gate electrode of the driving transistor located on the gate insulation layer and overlapping the semiconductor of the driving transistor;
an interlayer insulation layer covering the gate electrode of the first switch transistor, the gate electrode of the second switch transistor, and the gate electrode of the driving transistor;
a first driving voltage line arranged on the interlayer insulation layer and electrically connected to a source electrode or a drain electrode of the driving transistor;
a first electrode plate of a capacitor arranged on the substrate and overlapping the gate electrode of the driving transistor;
a first reference voltage line arranged on the substrate and extending in a first direction;
a second reference voltage line arranged on the substrate and extending in a second direction perpendicular to the first direction,
a first electrode of the first switch transistor electrically connected to the first reference voltage line,
a second electrode of the first switch transistor electrically connected to the first electrode plate of the capacitor;
a first electrode of the second switch transistor electrically connected to the second reference voltage line; and
a second electrode of the second switch transistor electrically connected to the gate electrode of the driving transistor.

2. The organic light-emitting display panel according to claim 1, wherein the first reference voltage line is located in a first metal layer.

3. The organic light-emitting display panel according to claim 2, wherein the first metal layer further comprises a data line extending in the first direction.

4. The organic light-emitting display panel according to claim 3, wherein the organic light-emitting display panel further comprises a third switch transistor, the third switch transistor having a first electrode electrically connected to the data line and a second electrode electrically connected to the first electrode plate of the capacitor.

5. The organic light-emitting display panel according to claim 3, wherein the first driving voltage line is located in the first metal layer, and the first driving voltage line extends in the first direction.

6. The organic light-emitting display panel according to claim 2, wherein the second reference voltage line is located in a second metal layer different from the first metal layer.

7. The organic light-emitting display panel according to claim 6, wherein the second reference voltage line is electrically connected to the first electrode of the second switch transistor via a through hole.

8. The organic light-emitting display panel according to claim 6, wherein the first electrode plate of the capacitor is located in the second metal layer.

9. The organic light-emitting display panel according to claim 6, wherein the organic light-emitting display panel further comprises a second driving voltage line electrically connected to the first driving voltage line.

10. The organic light-emitting display panel according to claim 9, wherein the second driving voltage line is located in the second metal layer and extends in the second direction.

11. The organic light-emitting display panel according to claim 6, wherein the organic light-emitting display panel further comprises a scan line extending in the second direction, and the scan line is electrically connected to the gate electrode of the second switch transistor.

12. The organic light-emitting display panel according to claim 11, wherein the organic light-emitting display panel further comprises a light-emitting control line extending in the second direction, and the light-emitting control line is electrically connected to the gate electrode of the first switch transistor.

13. The organic light-emitting display panel according to claim 12, wherein the scan line, the gate electrode of the second switch transistor, the light-emitting control line, and the gate electrode of the first switch transistor are all located in a third metal layer.

14. The organic light-emitting display panel according to claim 13, wherein the third metal layer and the second metal layer are located in a same film layer.

15. The organic light-emitting display panel according to claim 13, wherein the second metal layer is located between the third metal layer and the first metal layer.

16. The organic light-emitting display panel according to claim 1, further comprising:
   an anode;
   an organic light-emitting material layer arranged on the anode; and
   a cathode arranged on the organic light-emitting material layer,
   wherein the first reference voltage line or the second reference voltage line is arranged in a same film layer as the anode.

17. The organic light-emitting display panel according to claim 1, comprising:
   a plurality of sub-pixels arranged in a matrix, wherein each of the plurality of sub-pixels comprises the first switch transistor, the second switch transistor and the driving transistor,
   wherein the first electrodes of the first switch transistors of all sub-pixels in a same column of the matrix are electrically connected to a same first reference voltage line; and the first electrodes of the second switch transistors of all sub-pixels in a same row of the matrix are electrically connected to a same second reference voltage line.

18. The organic light-emitting display panel according to claim 1, wherein a reference voltage transmitted by the first reference voltage line is a positive potential and a reference voltage transmitted by the second reference voltage line is a negative potential.

19. An organic light-emitting display device, comprising:
   an organic light-emitting display panel comprising:
   a substrate;
   a semiconductor of a first switch transistor arranged on the substrate;
   a semiconductor of a second switch transistor arranged on the substrate;
   a semiconductor of a driving transistor arranged on the substrate and having one or more bending portions;
   a gate insulation layer covering the semiconductor of the first switch transistor, the semiconductor of the second switch transistor, and the semiconductor of the driving transistor;
   a gate electrode of the first switch transistor located on the gate insulation layer and overlapping the semiconductor of the first switch transistor;
   a gate electrode of the second switch transistor located on the gate insulation layer and overlapping the semiconductor of the second switch transistor;
   a gate electrode of the driving transistor located on the gate insulation layer and overlapping the semiconductor of the driving transistor;
   an interlayer insulation layer covering the gate electrode of the first switch transistor, the gate electrode of the second switch transistor, and the gate electrode of the driving transistor;
   a first driving voltage line arranged on the interlayer insulation layer and electrically connected to a source electrode or a drain electrode of the driving transistor;
   a first electrode plate of a capacitor arranged on the substrate and overlapping the gate electrode of the driving transistor;
   a first reference voltage line arranged on the substrate and extending in a first direction;
   a second reference voltage line arranged on the substrate and extending in a second direction perpendicular to the first direction;
   a first electrode of the first switch transistor electrically connected to the first reference voltage line,
   a second electrode of the first switch transistor electrically connected to the first electrode plate of the capacitor;
   a first electrode of the second switch transistor electrically connected to the second reference voltage line; and
   a second electrode of the second switch transistor electrically connected to the gate electrode of the driving transistor.

* * * * *